US011251517B2

(12) United States Patent
Li

(10) Patent No.: US 11,251,517 B2
(45) Date of Patent: Feb. 15, 2022

(54) ANTENNA ASSEMBLY AND ELECTRONIC DEVICE

(71) Applicant: GUANGDONG OPPO MOBILE TELECOMMUNICATIONS CORP., LTD., Guangdong (CN)

(72) Inventor: Si Li, Guangdong (CN)

(73) Assignee: GUANGDONG OPPO MOBILE TELECOMMUNICATIONS CORP., LTD., Dongguan (CN)

( * ) Notice: Subject to any disclaimer, the term of this patent is extended or adjusted under 35 U.S.C. 154(b) by 0 days.

(21) Appl. No.: 17/069,285

(22) Filed: Oct. 13, 2020

(65) Prior Publication Data

US 2021/0203058 A1 Jul. 1, 2021

(30) Foreign Application Priority Data

Dec. 26, 2019 (CN) .......................... 201911370482.9
Dec. 26, 2019 (CN) .......................... 201922425681.7

(51) Int. Cl.
*H01Q 1/24* (2006.01)
*H01Q 1/22* (2006.01)
(Continued)

(52) U.S. Cl.
CPC ............. *H01Q 1/2283* (2013.01); *H01Q 1/42* (2013.01); *H01Q 1/48* (2013.01); *H01Q 7/00* (2013.01); *H03H 7/38* (2013.01)

(58) Field of Classification Search
CPC .......... H01Q 1/2283; H01Q 1/42; H01Q 1/48; H01Q 7/00; H03H 7/38; H04B 5/0075; H04B 5/0031
(Continued)

(56) References Cited

U.S. PATENT DOCUMENTS 8,648,752 B2 * 2/2014 Ramachandran ........ H01Q 7/00
343/702
9,673,507 B2 * 6/2017 Ramachandran ........ H01Q 1/38
(Continued)

FOREIGN PATENT DOCUMENTS

CN 105940550 A 9/2016
CN 108172973 A 6/2018
(Continued)

OTHER PUBLICATIONS

Indian Examination Report for IN Application 202014046229 dated Jul. 26, 2021. (5 pages).
(Continued)

*Primary Examiner* — Jean B Jeanglaude
(74) *Attorney, Agent, or Firm* — Young Basile Hanlon & MacFarlane, P.C.

(57) ABSTRACT

An antenna assembly and an electronic device are disclosed. The antenna assembly includes a near-field-communication (NFC) integrated-circuit (IC), a conductive loop, and a radiation-field enhancer. The NFC IC includes a first differential signal port and a second differential signal port for providing a differential excitation current. The first metal stub extends from the first ground portion of the ground plane and electrically connected to the first differential signal port. The conductor is spaced apart from the ground plane, and is electrically connected to the second differential signal port and the second ground portion, respectively. The radiation-field enhancer is disposed between the conductor and the ground plane and configured to enhance a field strength of an NFC radiation-field generated by the conductor in response to the differential excitation current being transmitted.

20 Claims, 10 Drawing Sheets

(51) Int. Cl.
  *H01Q 1/42* (2006.01)
  *H01Q 1/48* (2006.01)
  *H01Q 7/00* (2006.01)
  *H03H 7/38* (2006.01)

(58) Field of Classification Search
  USPC .......................................................... 343/702
  See application file for complete search history.

(56) References Cited

U.S. PATENT DOCUMENTS

| | | | | |
|---|---|---|---|---|
| 9,838,088 | B2* | 12/2017 | Pernisek | .............. H04B 13/005 |
| 9,917,346 | B2* | 3/2018 | Ramachandran | ........ H01Q 1/50 |
| 10,193,597 | B1 | 1/2019 | Garrido Lopez et al. | |
| 10,200,092 | B1 | 2/2019 | Irci et al. | |
| 10,389,410 | B2* | 8/2019 | Brooks | ................ H04B 5/0062 |
| 10,396,438 | B1 | 8/2019 | Smith et al. | |
| 10,425,793 | B2* | 9/2019 | Sankaran | ................ G06F 13/14 |
| 2012/0249384 | A1 | 10/2012 | Kaikkonen et al. | |
| 2014/0225787 | A1* | 8/2014 | Ramachandran | ........ H01Q 9/42 343/702 |
| 2018/0331416 | A1* | 11/2018 | Yu | ............................ H01Q 9/42 |
| 2019/0007103 | A1* | 1/2019 | Brooks | .................... H01Q 5/40 |
| 2019/0007786 | A1* | 1/2019 | Sankaran | ........... H04L 29/06068 |

FOREIGN PATENT DOCUMENTS

| | | |
|---|---|---|
| CN | 108987899 A | 12/2018 |
| CN | 210838090 U | 6/2020 |

OTHER PUBLICATIONS

Communication under Rule 71(3) EPC for EP Application 20202019.4 dated Sep. 9, 2021. (7 pages).
International search report for International Application PCT/CN2020/123372 dated Jan. 26, 2021. (9 pages).
European search report for EP Application 20202019.4 dated Mar. 5, 2021. (5 pages).

* cited by examiner

ANTENNA ASSEMBLY AND ELECTRONIC DEVICE

CROSS-REFERENCE TO RELATED APPLICATION(S)

This application claims priority to Chinese Patent Applications No. 201911370482.9 and No. 201922425681.7, both filed on Dec. 26, 2019, the contents of both of which are herein incorporated by reference in their entireties.

TECHNICAL FIELD

The present disclosure generally relates to the technical field of communication, and in particular to an antenna assembly and an electronic device.

BACKGROUND

With the development of communication technology, more and more functions can be implemented in an electronic device such as a smart phone, and the electronic device shall have more diverse communication modes. For example, an electronic device can commonly support multiple communication modes such as cellular network communication, Wireless Fidelity (Wi-Fi) communication, Global Positioning System (GPS) communication, and Bluetooth (BT) communication. In addition, with the advancement of communication technology, the electronic devices have realized the Near Field Communication (NFC) recently. It can be understood that each communication mode of an electronic device needs a corresponding antenna to support.

On the other hand, with the development of electronic technology, electronic devices are becoming more and more miniaturized, lighter, and thinner, and have smaller internal spaces. Therefore, how to reasonably design the NFC antenna in electronic devices has become a problem.

SUMMARY

According to one aspect of the present disclosure, an antenna assembly is provided, which includes a near-field-communication (NFC) integrated-circuit (IC), a conductive loop, and a radiation-field enhancer. The NFC IC includes a first differential signal port and a second differential signal port for providing a differential excitation current. The conductive loop is configured to transmit the differential excitation current and includes a ground plane, a first metal stub, and a conductor. The ground plane includes a first ground portion, a second ground portion spaced apart from the first ground portion, and a conductive path defined between the first ground portion and the second ground portion. The first metal stub extends from the first ground portion and electrically connected to the first differential signal port. The conductor is spaced apart from the ground plane, and is electrically connected to the second differential signal port and the second ground portion, respectively. The radiation-field enhancer is disposed between the conductor and the ground plane and configured to enhance a field strength of an NFC radiation-field generated by the conductor in response to the differential excitation current being transmitted.

According to another aspect of the present disclosure, an electronic device is provided, which includes an antenna assembly. The antenna assembly includes a near-field-communication (NFC) integrated-circuit (IC), a conductive loop, and a radiation-field enhancer. The NFC IC includes a first differential signal port and a second differential signal port for providing a differential excitation current. The conductive loop is configured to transmit the differential excitation current and includes a ground plane, a first metal stub, and a conductor. The ground plane includes a first ground portion, a second ground portion spaced apart from the first ground portion, and a conductive path defined between the first ground portion and the second ground portion. The first metal stub extends from the first ground portion and electrically connected to the first differential signal port. The conductor is spaced apart from the ground plane, and is electrically connected to the second differential signal port and the second ground portion, respectively. The radiation-field enhancer is disposed between the conductor and the ground plane and configured to enhance a field strength of an NFC radiation-field generated by the conductor in response to the differential excitation current being transmitted.

According to yet another aspect of the present disclosure, another electronic device is provided, which includes a housing, a near-field-communication (NFC) integrated-circuit (IC), a conductor, and a radiation-field enhancer. The housing includes a metal cover, the metal cover including a ground plane defining a first gap such that a first stub is formed. The NFC IC includes a first differential signal port electrically connected to the first stub and a second differential signal port and configured to provide a differential excitation current. The conductor is spaced apart from the ground plane, and electrically connected to the second differential signal port and the second ground portion, respectively. The radiation-field enhancer is disposed between the conductor and the ground plane and configured to enhance a field strength of an NFC radiation-field generated by the conductor in response to the differential excitation current being transmitted.

BRIEF DESCRIPTION OF DRAWINGS

In order to make the technical solution described in the embodiments of the present disclosure more clearly, the drawings used for the description of the embodiments will be briefly described. Apparently, the drawings described below are only for illustration but not for limitation. It should be understood that, one skilled in the art may acquire other drawings based on these drawings, without making any inventive work.

DETAILED DESCRIPTION

Figure 1:
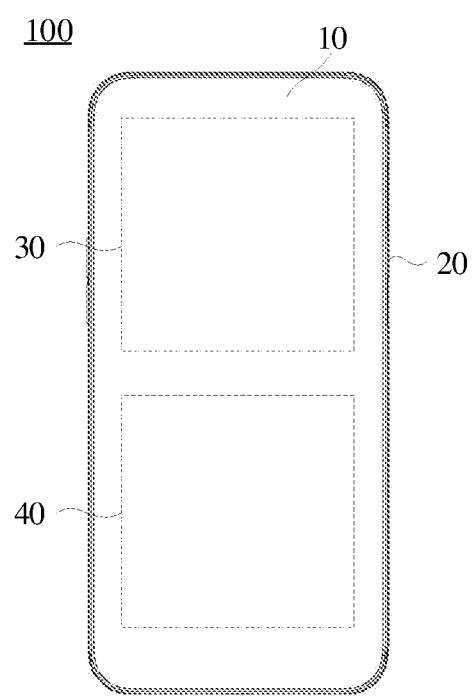
FIG. 1 is a schematic structural diagram of an electronic device according to some embodiments of the present disclosure.

The technical solutions in the embodiments of the present disclosure are clearly and completely described in the following with reference to the accompanying drawings in the embodiments of the present disclosure. It is obvious that the described embodiments are only a part of the embodiments of the present disclosure, but not all embodiments. All other embodiments obtained by a person skilled in the art based on the embodiments of the present disclosure without creative efforts are within the scope of the present disclosure.

An antenna assembly is provided, which includes a near-field-communication (NFC) integrated-circuit (IC), a conductive loop, and a radiation-field enhancer. The NFC IC includes a first differential signal port and a second differential signal port for providing a differential excitation current. The conductive loop is configured to transmit the differential excitation current and includes a ground plane, a first metal stub, and a conductor. The ground plane includes a first ground portion, a second ground portion spaced apart from the first ground portion, and a conductive path defined between the first ground portion and the second ground portion. The first metal stub extends from the first ground portion and electrically connected to the first differential signal port. The conductor is spaced apart from the ground plane, and is electrically connected to the second differential signal port and the second ground portion, respectively. The radiation-field enhancer is disposed between the conductor and the ground plane and configured to enhance a field strength of an NFC radiation-field generated by the conductor in response to the differential excitation current being transmitted.

In some embodiments, the first metal stub generates a first NFC radiation field and the conductive path generates a third NFC radiation field, in response to the differential excitation current being transmitted; wherein the second NFC radiation field is at least partially overlapped with the first NFC radiation field, and the third NFC radiation field is at least partially overlapped with the first NFC radiation field and the second NFC radiation field, respectively.

In some embodiments, the conductor includes a first conductor-segment, a second conductor-segment, and a third conductor-segment; the radiation-field enhancer is disposed between the ground plane and at least one of the first conductor-segment, the second conductor-segment, and the third conductor-segment.

In some embodiments, the first conductor-segment extends in a first direction, the second conductor-segment extends in a second direction perpendicular to the first direction, and the third conductor-segment extends in the first direction, wherein both the first direction and the second direction are parallel to the ground plane.

In some embodiments, the radiation-field enhancer includes a ferrite layer.

In some embodiments, the ferrite layer is symmetrical with respect to a direction in which the conductor extends, and an area of the ferrite layer is greater than an area of which the conductor is projected on the ferrite layer.

In some embodiments, the conductive loop further includes a second metal stub, extending from the second ground portion and electrically connected to the second differential signal port via the conductor.

In some embodiments, the conductive path includes a conductive sub-path parallel to a direction in which the conductor extends; a first current-direction in which the differential excitation current is transmitted in the conductor is opposite to a second current-direction in which the differential excitation current is transmitted in the conductive sub-path; the radiation-field enhancer is configured to enhance the second NFC radiation-field generated by the conductor in response to the differential excitation current being transmitted in the first current-direction and weaken another NFC radiation field generated by the conductive sub-path in response to differential excitation current being transmitted in the second current-direction.

In some embodiments, the conductive path further comprises another conductive sub-path and a yet another conductive sub-path sequentially connected, wherein the another conductive sub-path extends along the first metal stub, and the yet another conductive sub-path extends along the second metal stub.

In some embodiments, the second metal stub generates a fourth NFC radiation field, in response to the differential excitation current being transmitted; wherein the second NFC radiation field is at least partially overlapped with the fourth NFC radiation field.

In some embodiments, the antenna assembly further includes a first matching circuit, configured to match an impedance of the conductive loop in response to the differential excitation current being transmitted and including: a first port, electrically connected to the first differential signal port; a second port, electrically connected to the second differential signal port; a third port, electrically connected to the first metal stub; and a fourth port, electrically connected to the conductor.

In some embodiments, the antenna assembly further includes a first non-NFC IC, configured to provide a first non-NFC excitation signal; wherein the first metal stub is further electrically connected to the first non-NFC IC, and the first metal stub is further configured to transmit the first non-NFC excitation signal.

In some embodiments, the first metal stub includes: a first feeding port, electrically connected to the first differential signal port; and a third feeding port, spaced apart from the first feeding port and electrically connected to the first non-NFC IC; wherein a distance between the first feeding port and the first ground portion is greater than a distance between the third feeding port and the first ground portion.

In some embodiments, the antenna assembly further includes a second matching circuit, electrically connected to the third feeding port and the first non-NFC IC, respectively, and configured to match an impedance of the first metal stub in response to the differential excitation current being transmitted.

In some embodiments, the antenna assembly further includes a second non-NFC IC, configured to provide a second non-NFC excitation signal; wherein the second metal stub is further electrically connected to the second non-NFC IC, and the second metal stub is further configured to transmit the second non-NFC excitation signal.

In some embodiments, the second metal stub includes: a second feeding port, electrically connected to the second differential signal port; and a fourth feeding port, spaced apart from the second feeding port and electrically connected to the second non-NFC IC; wherein a distance between the second feeding port and the second ground portion is greater than a distance between the fourth feeding port and the second ground portion.

In some embodiments, the antenna assembly further includes a third matching circuit, electrically connected to the fourth feeding port and the second non-NFC IC, respectively, and configured to match an impedance of the second metal stub in response to the differential excitation current being transmitted.

An electronic device is provided, which includes an antenna assembly. The antenna assembly includes a near-field-communication (NFC) integrated-circuit (IC), a conductive loop, and a radiation-field enhancer. The NFC IC includes a first differential signal port and a second differential signal port for providing a differential excitation current. The conductive loop is configured to transmit the differential excitation current and includes a ground plane, a first metal stub, and a conductor. The ground plane includes a first ground portion, a second ground portion spaced apart from the first ground portion, and a conductive path defined between the first ground portion and the second ground portion. The first metal stub extends from the first ground portion and electrically connected to the first differential signal port. The conductor is spaced apart from the ground plane, and is electrically connected to the second differential signal port and the second ground portion, respectively. The radiation-field enhancer is disposed between the conductor and the ground plane and configured to enhance a field strength of an NFC radiation-field generated by the conductor in response to the differential excitation current being transmitted.

Another electronic device is provided, which includes a housing, a near-field-communication (NFC) integrated-circuit (IC), a conductor, and a radiation-field enhancer. The housing includes a metal cover, the metal cover including a ground plane defining a first gap such that a first stub is formed. The NFC IC includes a first differential signal port electrically connected to the first stub and a second differential signal port for providing a differential excitation current. The conductor is spaced apart from the ground plane, and electrically connected to the second differential signal port and the second ground portion, respectively. The radiation-field enhancer is disposed between the conductor and the ground plane and configured to enhance a field strength of an NFC radiation-field generated by the conductor in response to the differential excitation current being transmitted.

In some embodiments, the ground plane further defines a second gap such that a second stub is formed, and the second stub is electrically connected to the second differential signal port via the conductor. The first stub is spaced apart from the second stub, and a first direction in which the first stub extends is parallel to a second direction in which the second stub extends.

Embodiment of the present disclosure provides an electronic device. The electronic device may be a smartphone, a tablet computer, or a game device, an augmented reality (AR) device, an automobile device, a data storage device, an audio playback device, a video playback device, a notebook computer, a desktop computing device, etc.

FIG. 1 is a schematic structural diagram of an electronic device 100 according to some embodiments of the present disclosure.

The electronic device 100 includes a display screen 10, a housing 20, a circuit board 30, and a battery 40.

The display screen 10 is arranged in the housing 20 to form a display surface of the electronic device 100 for displaying information such as images and texts. The display screen 10 may include a liquid crystal display (LCD) or an organic light-emitting diode (OLED) display screen.

It is understandable that the display screen 10 may include a display surface and a non-display surface opposite to the display surface. The display surface is a surface of the display screen 10 facing a user. That is, the surface of the display screen 10 is visible to the user on the electronic device 100. The non-display surface is a surface of the display screen 10 facing the inside of the electronic device 100. The display surface is used to display information, and the non-display surface does not display information.

It is understandable that a cover may be provided on the display screen 10 to protect the display screen 10 from being scratched or damaged by water. The cover may be a transparent glass cover, so that the user can observe contents displayed on the display screen 10 through the cove. It is understandable that the cover may be a glass cover made of sapphire.

The housing 20 is used to form an outer contour of the electronic device 100, and used to accommodate electronic components and functional components of the electronic device 100 and have a sealing and protecting effect on the electronic components and functional components inside the electronic device. For example, a camera, a circuit board, and a vibration motor of the electronic device 100 can be arranged inside the housing 20. It is understandable that the housing 20 may include a metal middle-frame and a battery metal-cover.

The metal middle-frame may be a thin plate-like or sheet-like structure, or may be a hollow frame structure. The metal middle-frame is used to provide support for the electronic or functional components in the electronic device 100 so as to install the electronic and functional components of the electronic device 100 together. For example, the metal middle-frame can include grooves, protrusions, and through-holes to facilitate installation of the electronic or functional components of the electronic device 100. It is understandable that material of the metal middle-frame may include aluminum alloy, magnesium alloy, copper alloy, and the like.

The battery metal-cover is connected to the metal middle-frame. For example, the battery metal-cover may be attached to the metal middle-frame through an adhesive such as double-sided tape, so as to be connected to the metal middle-frame. The battery metal-cover, the metal middle-frame, and the display screen 10 are collectively used to seal the electronic and functional components of the electronic device 100 inside the electronic device 100 to protect the electronic and functional components of the electronic device 100. It is understandable that the battery metal-cover can be integrally formed. During a molding process of the battery metal-cover, the battery metal-cover may define a mounting hole for a rear camera and the like. It is understandable that the material of the battery metal-cover may also include aluminum alloy, magnesium alloy, copper alloy, and the like.

The circuit board 30 is arranged inside the housing 20. For example, the circuit board 30 may be installed and fixed on the metal middle-frame of the housing 20, and the circuit board 30 may be sealed inside the electronic device through the battery metal-cover. The circuit board 30 may be a main board of the electronic device 100. The circuit board 30 may also be integrated with one or more of functional components such as a processor, a camera, a headset interface, an acceleration sensor, a gyroscope, and a motor. Meanwhile, the display screen 10 may be electrically connected to the circuit board 30, and the display function of the display screen 10 is controlled by a processor on the circuit board 30.

The battery 40 is provided inside the case 20. For example, the battery 40 may be installed and fixed on the metal middle-frame of the housing 20, and the battery 40 may be sealed inside the electronic device through the battery metal-cover. The battery 40 is electrically connected to the circuit board 30 so that the battery 40 can supply power to the electronic device 100. The circuit board 30 may be provided with a power management circuit. The power management circuit is used to provide a voltage of the battery 40 to various electronic components in the electronic device 100.

The electronic device 100 also includes an antenna assembly 200. The antenna assembly 200 is used to implement a wireless communication function of the electronic device 100. For example, the antenna assembly 200 may be used to implement near field communication (NFC). It is understandable that a part of components of the antenna assembly 200 can be integrated on the circuit board 30 inside the housing 20. For example, a signal processing chip and a signal processing circuit in the antenna assembly 200 can be integrated on the circuit board 30. In addition, another part of the components of the antenna assembly 200 may also be directly arranged on the housing 20. For example, a radiator or conductor of the antenna assembly 200, which is used to radiate signals, may be directly arranged on the housing 20.

Figure 2:
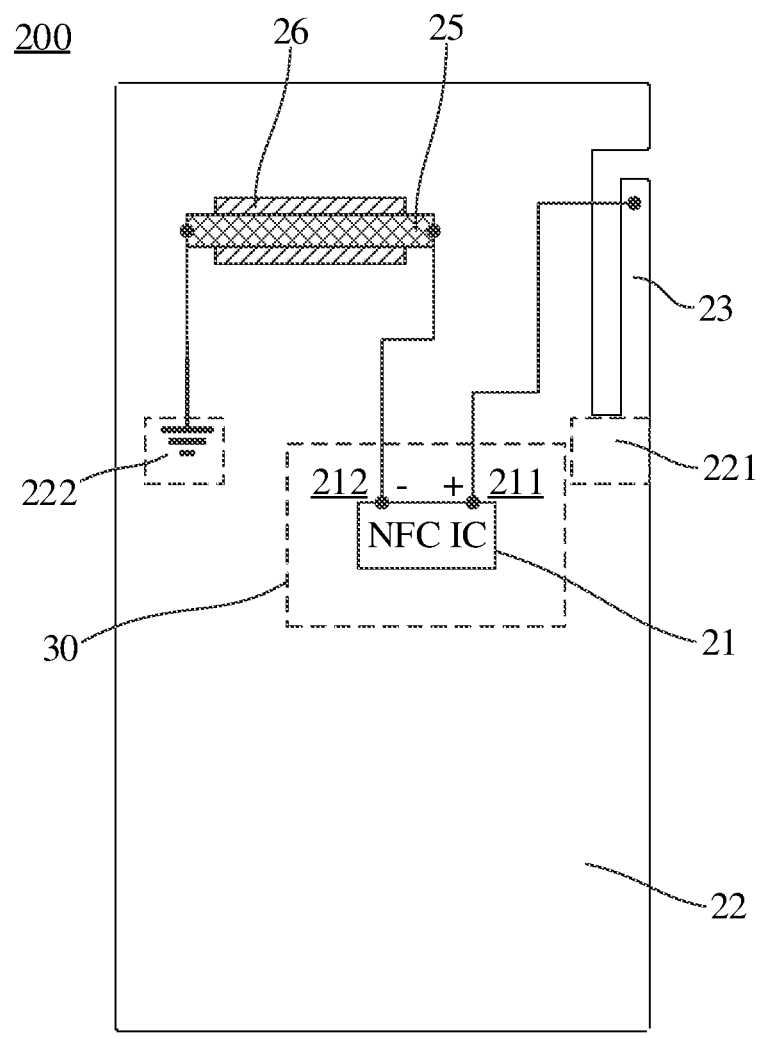
FIG. 2 is a first schematic diagram of an antenna assembly according to some embodiments of the present disclosure.

FIG. 2 is a first schematic diagram of an antenna assembly 200 according to some embodiments of the present disclosure. The antenna assembly 200 includes a near-field-communication (NFC) integrated-circuit (IC) 21, a ground plane 22, a first metal stub 23, a conductor 25, and a radiation-field enhancer 26.

The NFC IC 21 may be used to provide a differential excitation current, and the differential excitation current includes two current signals. The two current signals have the same amplitude and inverted phases, or it is understood that, the two current signals have phases with a difference of 180 degrees. In addition, the differential excitation current is balanced. It is understandable that, if an analog signal is directly transmitted during transmission, it is an unbalanced signal, and if an original analog signal is inverted in phase, and the inverted analog signal and the original analog signal are simultaneously transmitted, then, the inverted analog signal and the original analog signal are a pair of balanced signals. The balanced signals pass through a differential amplifier during the transmission process, where the original analog signal and the inverted analog signal are subtracted to obtain an enhanced original analog signal. Since two transmission lines are subject to the same interference during the transmission process, the same interference signal is subtracted in the process of subtraction. Thus, the balanced signals have better anti-interference performance.

The NFC IC 21 includes a first differential signal port 211 and a second differential signal port 212. For example, the first differential signal port 211 may be a positive (+) port of the NFC IC 21, and the second differential signal port 212 may be a negative (−) port of the NFC IC 21. The first differential signal port 211 and the second differential signal port 212 are used to transmit the differential excitation current. For example, the differential excitation current provided by the NFC IC 21 can be output to the antenna assembly 200 via the first differential signal port 211, and flow back to the NFC IC 21 via the second differential signal port 212. Thus, a current loop is formed. It can be understood that, in other embodiments, the first differential signal port 211 may be the negative (−) port of the NFC IC 21, and the second differential signal port 212 may be the positive (+) port of the NFC IC 21, port.

It can be understood that, as shown in FIG. 2, the NFC IC 21 may be arranged on the circuit board 30 of the electronic device 100. Alternatively, a small independent circuit board may be provided in the electronic device 100, and the NFC IC 21 may be integrated on the independent circuit board. For example, the independent circuit board may be a small board in the electronic device 100.

The ground plane 22 is used as a common ground. The ground plane 22 includes a first ground portion 221 and a second ground portion 222 spaced apart from each other. The first ground portion 221 and the second ground portion 222 may be, for example, terminals of the ground plane 22, raised structures on the ground plane 22, pads formed on the ground plane 22, or certain areas on the ground plane 22.

The ground plane 22 includes a conductive path between the first ground portion 221 and the second ground portion 222, and the conductive path may be used to conduct currents. That is, when a voltage signal is applied between the first ground portion 221 and the second ground portion 222, a current can be generated between the first ground portion 221 and the second ground portion 222, and then a current loop is formed. It can be understood that when the NFC IC 21 provides a differential excitation current, the conductive path between the first ground portion 221 and the second ground portion 222 can be used to transmit the differential excitation current.

Figure 3:
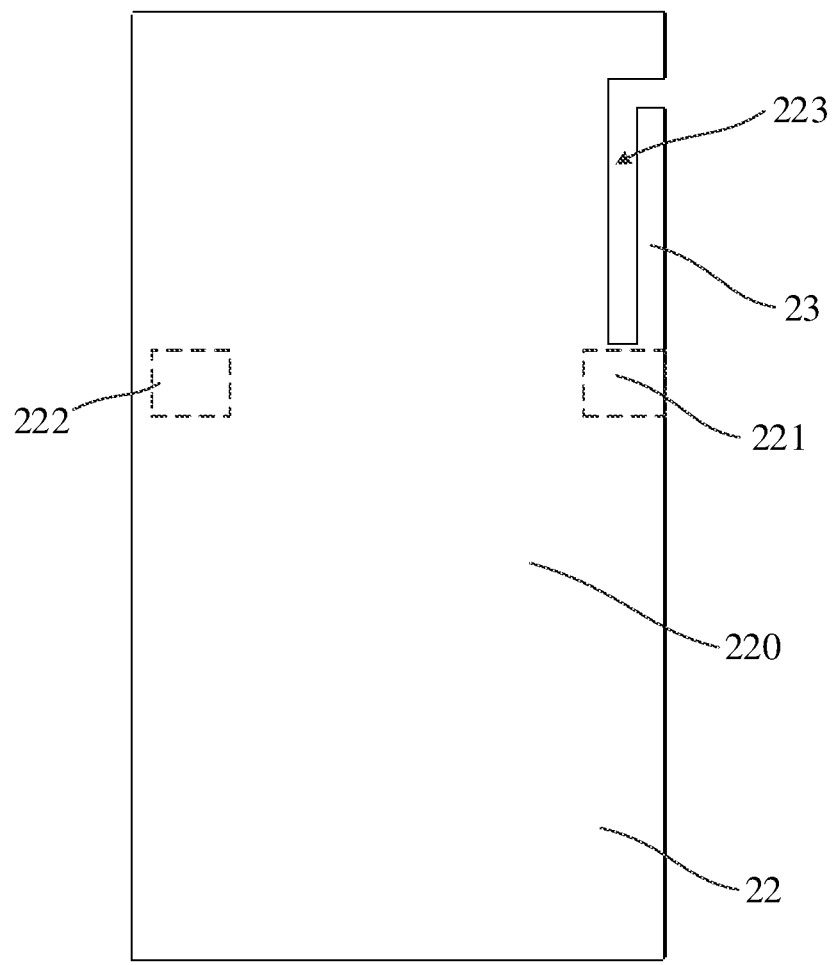
FIG. 3 is a plane schematic diagram of a ground plane in the antenna assembly in FIG. 2.

FIG. 3 is a schematic structural diagram of the ground plane 22 of the antenna assembly in FIG. 2. The ground plane 22 may be formed by a metal structure in the electronic device 100. For example, the ground plane 22 may be formed by the metal middle-frame of the electronic device 100, and that is, the ground plane 22 includes the metal middle-frame of the electronic device. For another example, the ground plane 22 may be formed by the battery metal-cover of the electronic device 100, and that is, the ground plane 22 includes the battery metal-cover of the electronic device.

On the ground plane 22, a first metal stub 23 extends from the first ground portion 221. For example, the first metal stub 23 may extend from the first ground portion 221 and in a direction parallel to a main body 220 of the ground plane 22. A first gap 223 is defined between the first metal stub 23 and the main body 220, so that a tail of the first metal stub 23 may be a free-end.

The first metal stub 23 is electrically connected to the first differential signal port 211 of the NFC IC 21, so that the first differential signal port 211 can feed power to the first metal stub 23.

The conductor 25 is spaced apart from the ground plane 22. For example, the conductor 25 may be arranged above the ground plane 22 in a thickness direction of the ground plane 22. The conductor 25 is electrically insulated from the ground plane 22. The conductor 25 is electrically connected to the second differential signal port 212 of the NFC IC 21, so that the second differential signal port 212 feeds power to the conductor 25. For example, one end of the conductor 25 may be electrically connected to the second differential signal port 212, and the other end of the conductor 25 may be grounded.

The radiation-field enhancer 26 is arranged between the conductor 25 and the ground plane 22. Material of the radiation-field enhancer 26 may include an insulating material. For example, the radiation-field enhancer 26 may include a ferrite layer made of a ferrite material, and the ferrite material may be nickel-copper-zinc-based materials containing iron oxide, copper oxide, zinc oxide, and nickel oxide. In addition, the ferrite material may also include some auxiliary materials, such as a specified amount of bismuth oxide, silicon oxide, magnesium oxide, and cobalt oxide. The radiation-field enhancer 26 may be used to enhance field strength of an NFC radiation field generated by the conductor 25 when a differential excitation current is transmitted. In some examples, the ferrite layer is symmetrical with respect to a direction in which the conductor 25 extends, and an area of the ferrite layer is greater than an area of which the conductor 25 is projected on the ferrite layer.

The conductor 25, the conductive path on the ground plane 22, and the first metal stub 23 together form a conductive loop for the transmission of the differential excitation current. That is, the conductive loop includes the conductor 25, the conductive path on the ground plane 22, and the first metal stub 23. That is, the differential excitation current is output from a signal port of the NFC IC 21, for example, the first differential signal port 211, then fed into the first metal stub 23, then transmitted to the conductive path on the ground plane 22 through the first metal stub 23, then transmitted to the conductor 25 via the conductive path, and finally flows back to the second differential signal port 212 of the NFC IC 21 through the conductor 25. Thus, a complete current loop is formed. In other words, a conductive route is defined along the first metal stub 23, the conductive path on the ground plane 22, and the conductor 25.

It is understandable that when the conductive loop transmits the differential excitation current, the conductor 25, the conductive path on the ground plane 22, and the first metal stub 23 can jointly generate an alternating electromagnetic field, and then an NFC signal is radiated to outside. This realizes NFC communication of the electronic device 100.

When the differential excitation current is transmitted the conductive loop, the first metal stub 23 generates a first NFC radiation field, the conductor 25 generates a second NFC radiation field, and the conductive path on the ground plane 22 generates a third NFC radiation field. The second NFC radiation field is at least partially overlapped with the first NFC radiation field, and the third NFC radiation field is at least partially overlapped with the first NFC radiation field and the second NFC radiation field, respectively. Therefore, the first NFC radiation field, the second NFC radiation field, and the third NFC radiation field can be mutually enhanced to increase field strength of the overall NFC radiation field of the antenna assembly 200. This can improve communication stability when the electronic device 100 performs NFC.

It is understandable that when the differential excitation current is transmitted in the conductor 25, the conductor 25 can generate an NFC radiation field, i.e. the second NFC radiation field. At this time, the radiation-field enhancer 26 can enhance field strength of the NFC radiation field generated by the conductor 25, and then enhance an NFC signal that is radiated to outside, which improves strength of the NFC signal of the electronic device 100.

It should be noted that when the differential excitation current is transmitted in the conductive path on the ground plane 22, although the radiation-field enhancer 26 also has an effect on an NFC radiation field generated by the conductive path, the radiation-field enhancer 26 has a weakening effect on the NFC radiation field generated by the conductive path at a side compared with the other side where the conductor 25 is located, rather than an enhancing effect. This is because the NFC signal radiated from the antenna assembly 200 is mainly concentrated on the side where the conductor 25 is located, and the radiation-field enhancer 26 has a shielding effect on electromagnetic signals.

Figure 4:
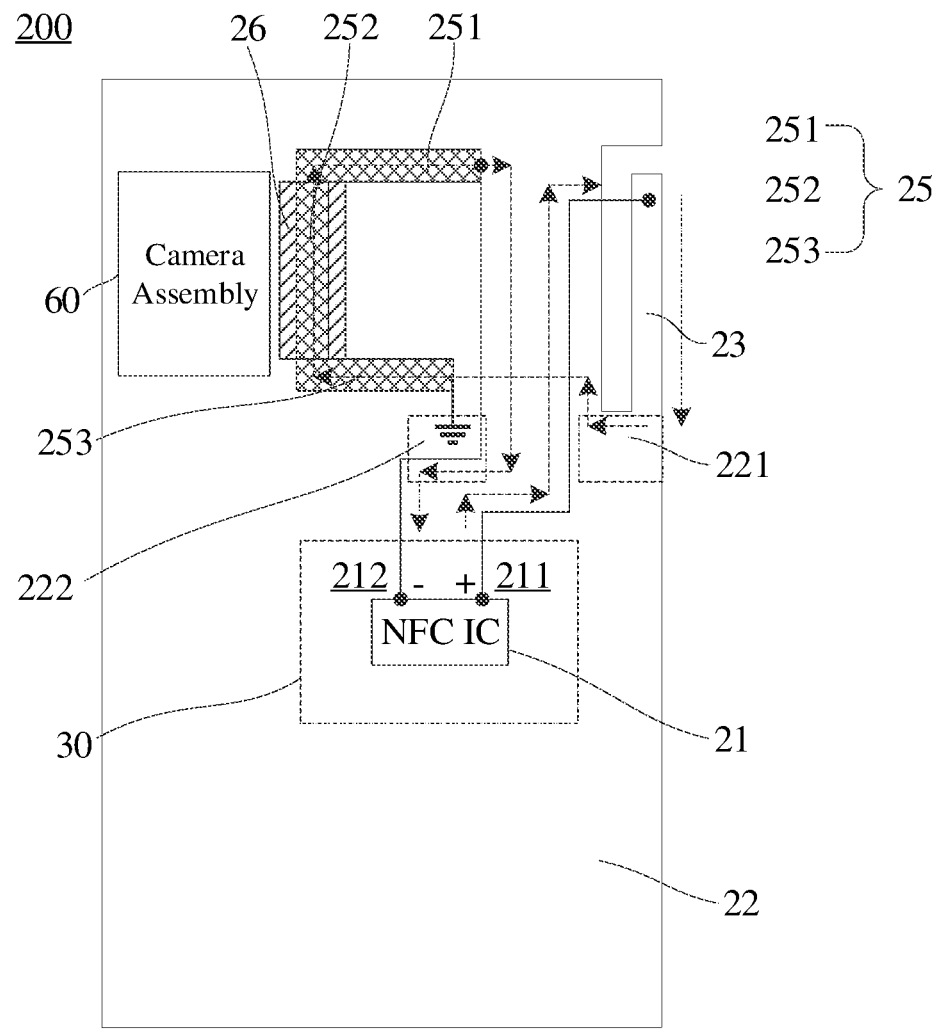
FIG. 4 is a second schematic diagram of an antenna assembly according to some embodiments of the present disclosure.

FIG. 4 is a second schematic diagram of an antenna assembly 200 according to some embodiments of the present disclosure.

The conductor 25 includes a first conductor-segment 251, a second conductor-segment 252, and a third conductor-segment 253. The first conductor-segment 251, the second conductor-segment 252, and the third conductor-segment 253 are sequentially connected. The radiation-field enhancer 26 may be disposed between the ground plane 22 and at least one of the first conductor-segment 251, the second conductor-segment 252, and the third conductor-segment 253. For example, the radiation-field enhancer 26 is disposed between the first conductor-segment 251 and the ground plane 22, between the second conductor-segment 252 and the ground plane 22, or between the third conductor-segment 253 and the ground plane 22. The radiation-field enhancer 26 may also be disposed simultaneously between the ground plane 22 and all of the first conductor-segment 251, the second conductor-segment 252, and the third conductor-segment 253. Therefore, the radiation-field enhancer 26 may only enhance an NFC radiation field generated by one or two conductor-segments, or may enhance an NFC radiation field generated by all of the conductor-segments of the conductor 25.

The first conductor-segment 251 extends along a first direction. The first direction may be a preset direction. For example, the first direction may be a direction parallel to an edge of the ground plane 22. The second conductor-segment 252 extends along a second direction, and the second direction is perpendicular to the first direction. For example, the second direction may be a direction parallel to another edge of the ground plane 22, and the above two edges are perpendicular to each other. Both the first direction and the second direction are parallel to the ground plane. The third conductor-segment 253 extends along the first direction. Therefore, the first conductor-segment 251, the second conductor-segment 252, and the third conductor-segment 253 may form a loop-structure, or a C-shaped structure as understood. Therefore, when the differential excitation current is transmitted, NFC radiation fields generated by the first conductor-segment 251, the second conductor-segment 252, and the third conductor-segment 253 can cover with each other such that the NFC radiation fields are overlapped with each other. Thus, field strength of an NFC radiation field in an area covered by the conductor 25 is enhanced. Therefore, this can not only increase effective reading-and-writing (card-swiping) area of the NFC antenna of the electronic device 100, but also improve stability of the NFC antenna of the electronic device 100 during reading-and-writing (card-swiping).

It can be understood that the electronic device 100 may further include a camera assembly 60. The camera assembly 60 is spaced apart from the ground plane 22. For example, the camera assembly 60 and the conductor 25 may be arranged at the same side of the ground plane 22. The camera assembly 60 may include one or more cameras and other functional components such as a camera decoration.

The second conductor-segment 252 of the conductor 25 is arranged in parallel with the camera assembly 60, and both the first conductor-segment 251 and the third conductor-segment 253 are located at the same side of the camera assembly 60. Alternatively, it can be understood that, the first conductor-segment 251 extends towards the camera assembly 60, the second conductor-segment 252 extends along a direction parallel to the camera assembly 60 from an end of the first conductor-segment 251, and the third conductor-segment 253 extends away from the camera assembly 60 from an end of the second conductor-segment 252.

It is understandable that, the camera assembly 60 occupies a relatively large internal space in the electronic device 100. Therefore, as the second conductor-segment 252 extends along a direction parallel to the camera assembly 60, it can pass away the camera assembly 60 to set the layout of the conductor 25, which facilitates the layout of the conductor 25. Further, the C-shaped structure formed by the first conductor-segment 251, the second conductor-segment 252, and the third conductor-segment 253 can also increase NFC field strength of the area covered by the conductor 25, which increases the effective reading-and-writing (card-swiping) area of the NFC antenna of the electronic device 100.

Figure 5:
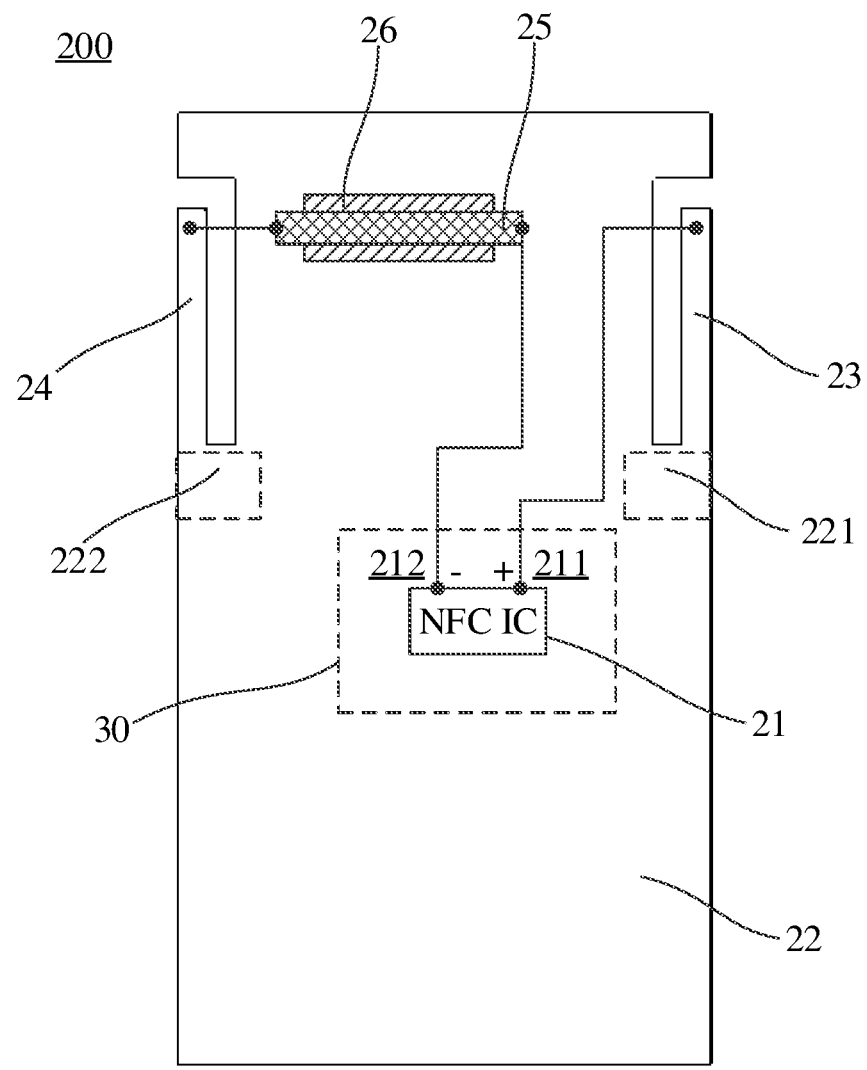
FIG. 5 is a third schematic diagram of an antenna assembly according to some embodiments of the present disclosure.
Figure 6:
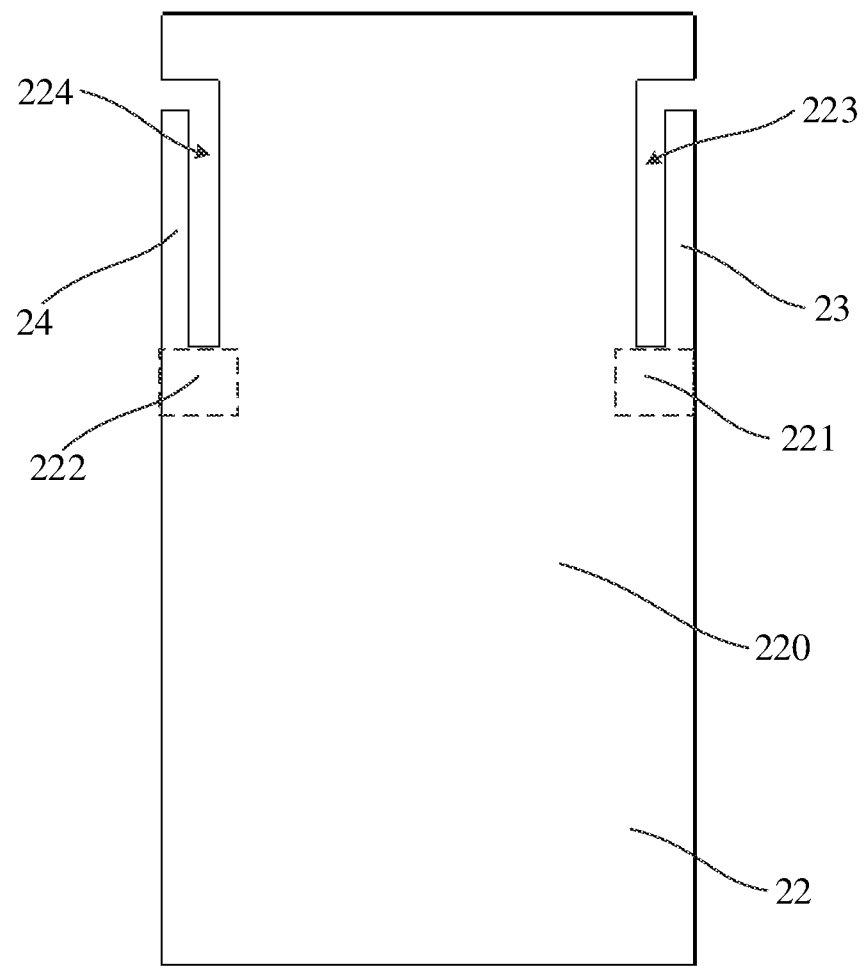
FIG. 6 is a plane schematic diagram of a ground plane in the antenna assembly in FIG. 5.

FIG. 5 is a third schematic diagram of an antenna assembly 200 according to some embodiments of the present disclosure, and FIG. 6 is a schematic diagram of the ground plane 22 in the antenna assembly in FIG. 5.

On the ground plane 22, a second metal stub 24 may also extend from the second ground portion 222 and in a direction parallel to the main portion 220 of the ground plane 22. A second gap 224 is defined between the second metal stub 24 and the main body 220, so that a tail of the second metal stub 24 can also form a free-end. It should be noted that, the second metal stub 24 may extend in a direction same to or different from that of the first metal stub 23.

It is understandable that the first metal stub 23 and the second metal stub 24 can be formed in a way of machining. For example, the main body 220 may be firstly formed by a molding process such as injection molding, and then the first gap 223 and the second gap 224 may be processed on the main body 220 in a way of machining such as turning or milling. The main body 220 is penetrated as the first gap 223 and the second gap 224 extend in the thickness direction of the main body 220, such that the first metal stub 23 and the second metal stub 24 are formed.

The second metal stub 24 is electrically connected to the second differential signal port 212 of the NFC IC 21 through the conductor 25. For example, an end of the conductor 25 may be electrically connected to the second differential signal port 212, and the other end of the conductor 25 may be electrically connected to the second metal stub 24, thereby realizing that the second metal stub 24 is electrically connected to the second differential signal port 212. Therefore, the second metal stub 24 can also be used to transmit the differential excitation current provided by the NFC IC 21. That is, the conductor 25, the second metal stub 24, the conductive path on the ground plane 22, and the first metal stub 23 together form a conductive loop for the transmission of the differential excitation current. In other words, the conductive loop includes the conductor 25, the second metal stub 24, the conductive path on the ground plane 22, and the first metal stub 23, or a conductive route is formed along the first metal stub 23, the conductive path on the ground plane 22, the second metal stub 24, and the conductor 25.

It is understandable that the differential excitation current is transmitted in the second metal stub 24, and so the second metal stub 24 can also generate an NFC radiation field and radiates an NFC signal outward. This further increases NFC signal coverage of the electronic device 100. Therefore, this further increase the effective reading-and-writing (card-swiping) area of the NFC antenna of the electronic device 100.

Figure 7:
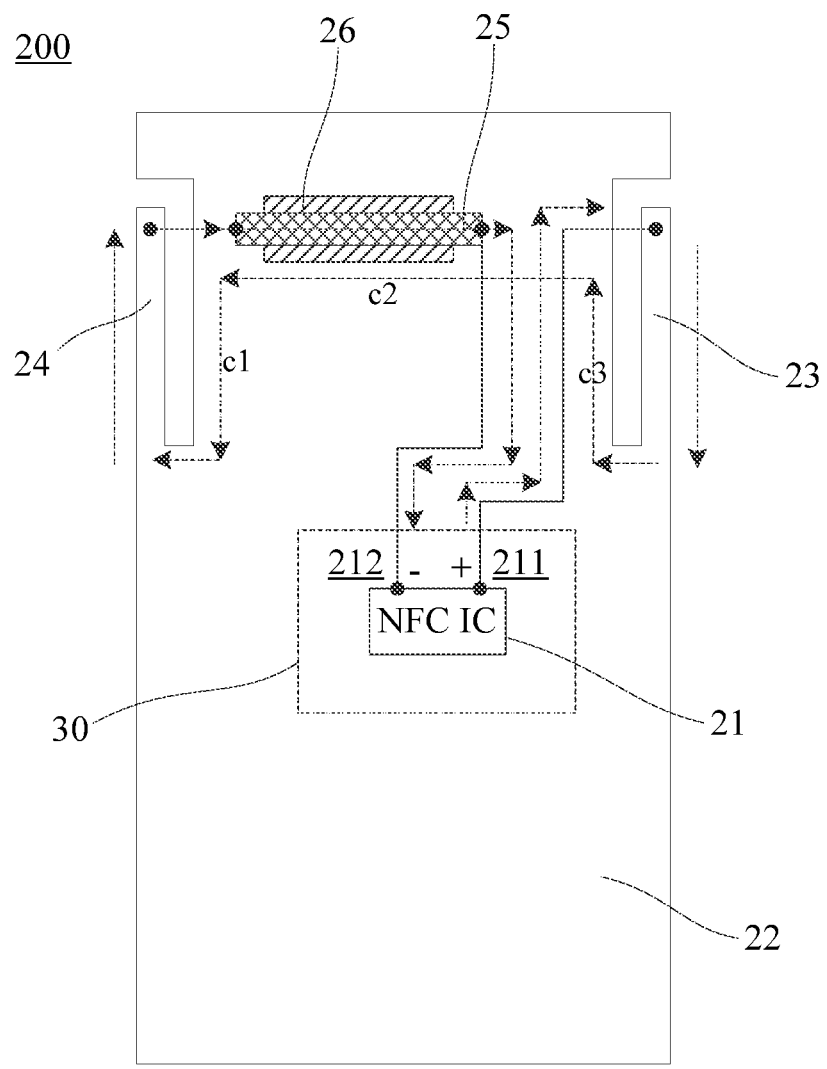
FIG. 7 is a schematic diagram of a current path in an antenna assembly according to some embodiments of the present disclosure.

FIG. 7 is a schematic diagram of a current path in the antenna assembly 200 according to some embodiments of the present disclosure. When the differential excitation current is transmitted in the conductive loop, the current is transmitted from the first differential signal port 211 of the NFC IC 21 to the first metal stub 23, then transmitted from the first metal stub 23 to the ground plane 22, then transmitted to the second metal stub 24 through the conductive path on the ground plane 22, and then transmitted from the second metal stub 24 to the conductor 25, and finally transmitted from the conductor 25 to the second differential signal port 212 of the NFC IC 21.

It should be noted that, according to the theory of electromagnetic field, when the conductive path on the ground plane 22 transmits the differential excitation current, the current flows the first metal stub 23, the second metal stub 24, and the conductor 25. Therefore, a direction of the current in a part of the conductive path is opposite to a direction of the current in the conductor 25. That is, a first current-direction in which the current is transmitted in the conductor 25 is opposite to a second current-direction in which the current is transmitted in a conductive sub-path of the conductive path, and the conductive sub-path of the conductive path is parallel to a direction in which the conductor 25 extends. Therefore, a direction of the NFC radiation field generated by a part of the conductive path on the ground plane 22 is also opposite to a direction of the NFC radiation field generated by the conductor 25. At this time, the radiation-field enhancer 26 enhances the NFC radiation field generated by the conductor 25, and weakens the NFC radiation field generated by the part of the conductive path on the ground plane 22. That is, the radiation-field enhancer 26 enhances the NFC radiation field generated by the conductor 25 in response to the differential excitation current being transmitted in the first current-direction, and weakens the NFC radiation field generated by the conductive sub-path of the conductive path on the ground plane 22 in response to differential excitation current being transmitted in the second current-direction. This avoids the NFC radiation field generated by the conductor 25 and the part of the NFC radiation field generated by the conductive path, which are opposite, from being mutually compensated, and further enhances the field strength of the NFC radiation field generated by the conductor 25.

When the differential excitation current is transmitted in the conductive loop, the first metal stub 23 generates a first NFC radiation field, and the first NFC radiation field can cover an area with a certain space around the electronic device 100. The conductor 25 generates a second NFC radiation field, and the second NFC radiation field may also cover a certain spatial area around the electronic device 100. The conductive path of the ground plane 22 generates a third NFC radiation field, and the third NFC radiation field also covers a certain spatial area around the electronic device 100. The second metal stub 24 generates a fourth NFC radiation field, and the fourth NFC radiation field may also cover a certain spatial area around the electronic device 100.

It can be understood that the direction of the second NFC radiation field is opposite to the direction of a part of the third NFC radiation field. The radiation-field enhancer 26 is used to enhance the second NFC radiation field and weaken the part of the third NFC radiation field whose direction is opposite to the direction of the second NFC radiation field. Therefore, this avoids the second NFC radiation field and the part of the third NFC radiation field which are opposite from being mutually compensated, and enhances the field strength of the second NFC radiation field.

It is understandable that, since the conductive path on the ground plane 22 is relatively long, as shown in FIG. 7, the conductive path is divided into a first conductive sub-path c1, a second conductive sub-path c2, and a third conductive sub-path c3 according to positional relationships between the conductive path and the first metal stub 23, the second metal stub 24, and the conductor 25. The first conductive sub-path c1, the second conductive sub-path c2, and the third conductive sub-path c3 are connected in sequence. The first conductive sub-path c1 is formed along the first metal stub 23, the second conductive sub-path c2 is formed along the conductor 25, and the third conductive sub-path c3 is formed along the second metal stub 24.

For the first conductive sub-path c1, the second conductive sub-path c2, and the third conductive sub-path c3, a direction of the NFC radiation field generated by the second conductive sub-path c2 is opposite to a direction of the second NFC radiation field generated by the conductor 25, and directions of NFC radiation fields generated by the first conductive sub-path c1 and the third conductive sub-path c3 may be the same as the direction of the second NFC radiation field generated by the conductor 25. At this time, the radiation-field enhancer 26 is used to weaken the NFC radiation field generated by the second conductive sub-path c2, and be used to enhance NFC radiation fields generated by the first conductive sub-path c1 and the third conductive sub-path c3.

The area covered by the first NFC radiation field, the area covered by the second NFC radiation field, and the area covered by the fourth NFC radiation field are different from each other, but may partially overlap. The second NFC radiation field is at least partially overlapped with the first NFC radiation field, so that the second NFC radiation field and the first NFC radiation field can be mutually enhanced. The fourth NFC radiation field is at least partially overlapped with the second NFC radiation field generated by the conductor 25, so that the fourth NFC radiation field and the second NFC radiation field can be mutually enhanced. In addition, the fourth NFC radiation field can also be at least partially overlapped with the first NFC radiation field generated by the first metal stub 23, so that the fourth NFC radiation field and the first NFC radiation field can also be mutually enhanced. Therefore, the stability of the NFC antenna of the electronic device 100 during reading-and-writing (card-swiping) can be improved.

For example, in practical applications, when an area close to the first metal stub 23 of an NFC receiver (such as a subway-card reader) reads the NFC signal, the first NFC radiation field generated by the first metal stub 23 serves as a main radiation field. The fourth NFC radiation field formed by the second metal stub 24 can compensate the main radiation field, i.e. compensate positions with weak field strength in the main radiation field. Thus, field strength of the entire area of the main radiation field can be enhanced. Similarly, when an area close to the second metal stub 24 of the NFC receiver reads the NFC signal, the fourth NFC radiation field generated by the second metal stub 24 serves as a main radiation field, and the first NFC radiation field generated by the first metal stub 23 can compensate the main radiation field.

Therefore, it can ensure that any area of the NFC radiation fields generated by the first metal stub 23 and the second metal stub 24 can transmit and receive NFC signals in the electronic device 100, so that the electronic device 100 can perform NFC communication with other electronic devices.

In addition, it is understandable that, as the second NFC radiation field generated by the conductor 25 is at least partially overlapped with the first NFC radiation field may, and the second NFC radiation field is also at least partially overlapped with the fourth NFC radiation field, the second NFC radiation field and the first NFC radiation field can be mutually enhanced, and the second NFC radiation field and the fourth NFC radiation field can also be mutually enhanced. Thus, the area of the NFC radiation field around the electronic device 100 can be enhanced, and the field strength of the overlapping area can be also enhanced. Therefore, this can not only increase effective reading-and-writing (card-swiping) area of the NFC antenna of the electronic device 100, but also improve stability of the NFC antenna of the electronic device 100 during reading-and-writing (card-swiping).

In the antenna assembly 200 according to the embodiments of the present disclosure, the first metal stub 23 is formed on the ground plane 22, the conductor 25 is disposed on the ground plane 22, and the conductive path is defined on the ground plane 22. Further, the first metal stub 23, the conductive path, and the conductor 25 collectively form a conductive loop for transmission of NFC differential excitation current, and a radiation-field enhancer 26 is provided between the conductor 25 and the ground plane 22. The radiation-field enhancer 26 can enhance the field strength of the NFC radiation field generated by the conductor 25. Since the first metal stubs 23 can be formed at different locations of the ground plane 22 according to requirements of the internal space design of the electronic device 100, and the conductor 25 can also be arranged at different locations of the electronic device 100, the NFC antenna can be designed through different locations of the electronic device 100. Therefore, the space occupied by the NFC antenna can be saved, and the layout of the NFC antenna can be more flexible. In addition, the radiation-field enhancer 26 of the antenna assembly 200 can enhance the field strength of the NFC radiation field generated by the conductor 25, which improves strength and coverage of NFC signals of the electronic device 100.

Figure 8:
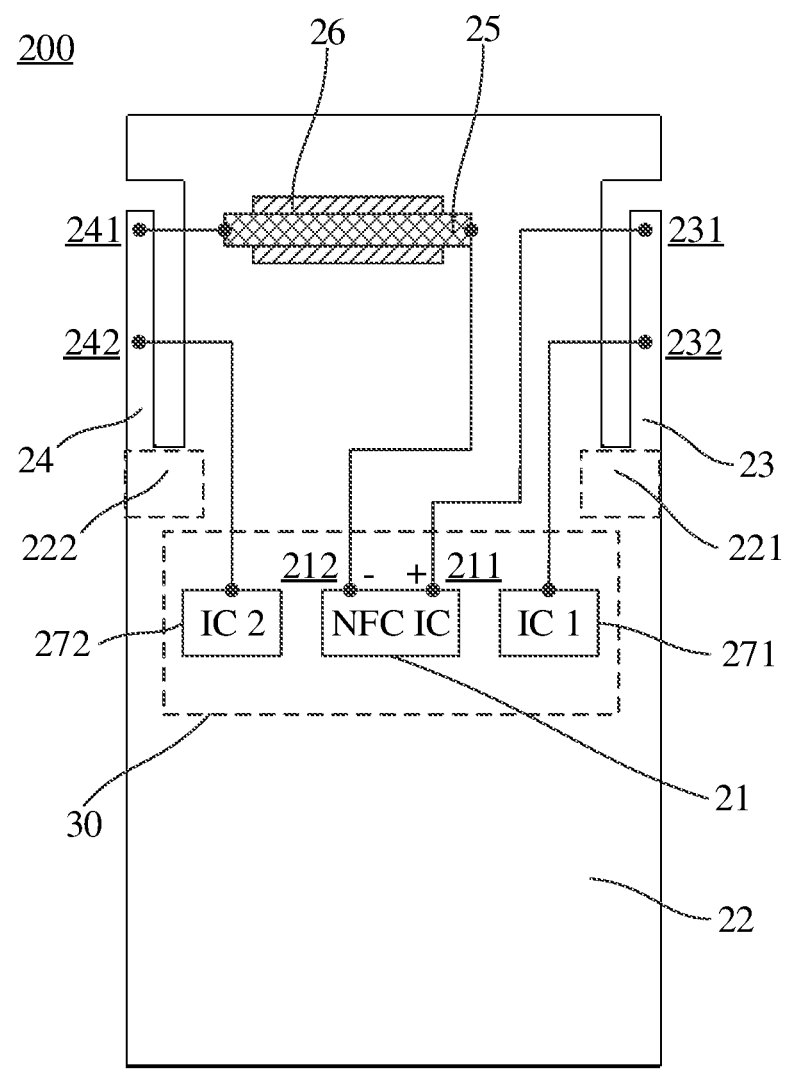
FIG. 8 is a fourth schematic diagram of an antenna assembly according to some embodiments of the present disclosure.

FIG. 8 is a fourth schematic diagram of an antenna assembly 200 according to some embodiments of the present disclosure. The antenna assembly 200 further includes a first non-NFC IC 271 and a second non-NFC IC 272. The first non-NFC IC 271 is, for example, IC 1, and the second non-NFC IC 272 is, for example, IC 2. It can be understood that both the first non-NFC IC 271 and the second non-NFC IC 272 can be integrated on the circuit board 30 of the electronic device 100.

The first non-NFC IC 271 is used to provide a first non-NFC excitation signal. The first non-NFC excitation signal is an unbalanced signal. The first non-NFC excitation signal may include one of a cellular network signal, a Wi-Fi signal, a GPS signal, and a BT signal. Correspondingly, the first non-NFC IC 271 may be a cellular communication chip for providing the cellular network signal, the first non-NFC IC 271 may be a Wi-Fi chip for providing the Wi-Fi signal, the first non-NFC IC 271 may be a GPS chip for providing the GPS signal, or the first non-NFC IC 271 may be a BT chip for providing the BT signal.

The first metal stub 23 is also electrically connected to the first non-NFC IC 271, and the first non-NFC IC 271 is grounded. Therefore, the first non-NFC IC 271 can feed the first non-NFC excitation signal to the first metal stub 23. Therefore, the first metal stub 23 can also be used to transmit the first non-NFC excitation signal.

It is understandable that the first metal stub 23 can be used to transmit the differential excitation current provided by the NFC IC 21, and can also be used to transmit the first non-NFC excitation signal provided by the first non-NFC IC 271. Thus, the multiplexing of the first metal stubs 23 is realized, which can reduce the number of radiators for transmitting wireless signals in the electronic device 100. Therefore, the internal space of the electronic device 100 can be saved.

It should be noted that the frequency of the NFC signal is usually 13.56 MHz, the frequency of the cellular network signal is usually 700 MHz or more, the frequency of the Wi-Fi signal is usually 2.4 GHz or 5 GHz, and the frequency of the GPS signal usually includes multiple frequency bands such as 1.575 GHz, 1.227 GHz, 1.381 GHz, 1.841 GHz, etc. The frequency of BT signal is usually 2.4 GHz. Therefore, compared to cellular network signals, Wi-Fi signals, GPS signals, and BT signals, NFC signals are low-frequency signals, and the cellular network signals, Wi-Fi signals, GPS signals, and BT signals are high-frequency signals. Alternatively, it can be understood that, the NFC signal is a low-frequency signal, the first non-NFC excitation signal is a high-frequency signal, and the frequency of the NFC signal is less than the frequency of the first non-NFC excitation signal.

In addition, it should be noted that when transmitting wireless signals, the lower frequency of a wireless signal is, the longer a required radiator-length is. Further, the higher the frequency of the wireless signal, the shorter the required radiator-length. That is, a radiator-length for transmitting the NFC signal is greater than a radiator-length for transmitting the first non-NFC excitation signal.

The first metal stub 23 includes a first feeding port 231 and a third feeding port 232 spaced from each other. The first feeding port 231 is electrically connected to the first differential signal port 211. The third feeding port 232 is electrically connected to the first non-NFC IC 271. A distance between the first feeding port 231 and the first ground portion 221 is greater than a distance between the third feeding port 232 and the first ground portion 221. Therefore, in the first metal stub 23, the radiator-length for transmitting the NFC signal is greater than the radiator-length for transmitting the first non-NFC excitation signal.

The second non-NFC IC 272 is used to provide a second non-NFC excitation signal. The second non-NFC excitation signal is an unbalanced signal. The second non-NFC excitation signal may include one of a cellular network signal, a Wi-Fi signal, a GPS signal, and a BT signal. Correspondingly, the second non-NFC IC 272 may be a cellular communication chip for providing the cellular network signal, the second non-NFC IC 271 may be a Wi-Fi chip for providing the Wi-Fi signal, the second non-NFC IC 271 may be a GPS chip for providing the GPS signal, or the second non-NFC IC 271 may be a BT chip for providing the BT signal.

It should be noted that the second non-NFC excitation signal and the first non-NFC excitation signal may have same communication type or different communication types. Correspondingly, the second non-NFC IC 272 and the first non-NFC IC 271 may have same type, or different types.

The second metal stub 24 is also electrically connected to the second non-NFC IC 272, and the second non-NFC IC 272 is grounded. Therefore, the second non-NFC IC 272 can feed the second non-NFC excitation signal to the second metal stub 24. Therefore, the second metal stub 24 can also be used to transmit the second non-NFC excitation signal.

It is understandable that the second metal stub 24 can be used to transmit the differential excitation current provided by the NFC IC 21, and can also be used to transmit the second non-NFC excitation signal provided by the second non-NFC IC 272. Thus, the multiplexing of the second metal stubs 24 is realized, which can reduce the number of radiators for transmitting wireless signals in the electronic device 100. Therefore, the internal space of the electronic device 100 can be saved.

The second metal stub 24 includes a second feeding port 241 and a fourth feeding port 242 spaced from each other. The second feeding port 241 is electrically connected to the second differential signal port 212. The fourth feeding port 242 is electrically connected to the second non-NFC IC 272. A distance between the second feeding port 241 and the second ground portion 222 is greater than a distance between the fourth feeding port 242 and the second ground portion 222. Therefore, in the second metal stub 24, the radiator-length for transmitting the NFC signal is greater than the radiator-length for transmitting the second non-NFC excitation signal.

Figure 9:
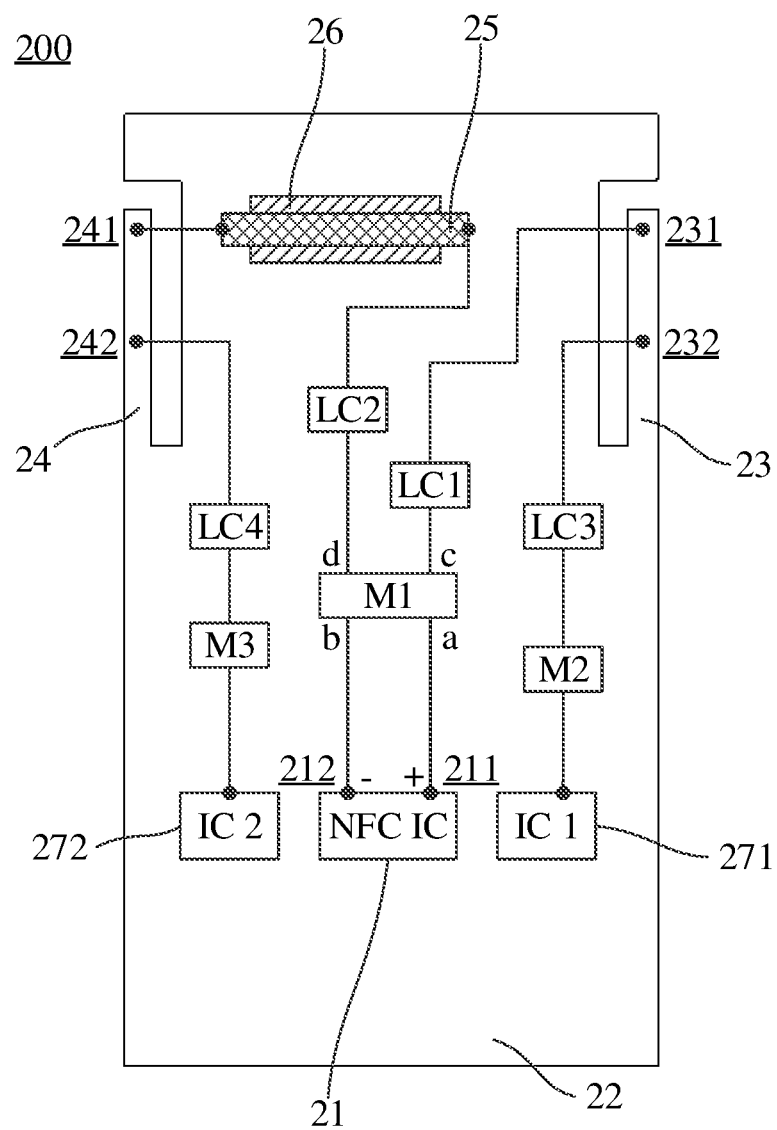
FIG. 9 is a fifth schematic diagram of an antenna assembly according to some embodiments of the present disclosure.

FIG. 9 is a fifth schematic diagram of an antenna assembly 200 according to some embodiments of the present disclosure. The antenna assembly 200 further includes a first matching circuit M1, a second matching circuit M2, a third matching circuit M3, a first filter circuit LC1, a second filter circuit LC2, a third filter circuit LC3, and a fourth filter circuit LC4. It can be understood that a matching circuit may also be called a matching network, a tuning circuit, a tuning network, and so on. A filter circuit can also be called a filter network.

The first matching circuit M1 is electrically connected to the first differential signal port 211 of the NFC IC 21, the second differential signal port 212 of the NFC IC 21, the conductor 25, and the first metal stub 23. The first matching circuit M1 is used to match an impedance of the conductive loop when the differential excitation current is transmitted. The conductive loop is formed along the first metal stub 23, the conductive path on the ground plane 22, and the conductor 25, or formed along the first metal stub 23, the conductive path on the ground plane 22, the second metal stub 24, and the conductor 25.

The first matching circuit M1 includes a first port 'a', a second port 'b', a first port 'c', and a second port 'd'. The first port 'a' is electrically connected to the first differential signal port 211 of the NFC IC 21, the second port 'b' is electrically connected to the second differential signal port 212 of the NFC IC 21, the first port 'c' is electrically connected to the first metal stub 23, and the second port 'd' is electrically connected to the conductor 25.

The first filter circuit LC1 is arranged between the first port 'c' of the first matching network M1 and the first metal stub 23. The first filter circuit LC1 is used to filter a first interference signal between the first port 'c' of the first matching network M1 and the first metal stub 23. The first interference signal is an electrical signal other than the differential excitation current provided by the NFC IC 21.

The second filter circuit LC2 is arranged between the second port 'd' of the first matching circuit M1 and the conductor 25. The second filter circuit LC2 is used to filter a second interference signal between the second port 'd' of the first matching circuit M1 and the conductor 25. The second interference signal is an electrical signal other than the differential excitation current provided by the NFC IC 21.

The first non-NFC IC 271 is electrically connected to the first metal stub 23 through the second matching circuit M2. The second matching circuit M2 is used to match an impedance of the first metal stub 23 when the first non-NFC excitation signal is transmitted.

The third filter circuit LC3 is arranged between the second matching circuit M2 and the first metal stub 23. The third filter circuit LC3 is used to filter a third interference signal between the second matching circuit M2 and the first metal stub 23. The third interference signal is an electrical signal other than the first non-NFC excitation signal provided by the first non-NFC IC 271.

The second non-NFC IC 272 is electrically connected to the second metal stub 24 through the third matching circuit M3. The third matching circuit M3 is used to match an impedance of the second metal stub 24 when the first non-NFC excitation signal is transmitted.

The fourth filter circuit LC4 is arranged between the third matching circuit M3 and the second metal stub 24. The fourth filter circuit LC4 is used to filter a fourth interference signal between the third matching circuit M3 and the second metal stub 24. The fourth interference signal is an electrical signal other than the second non-NFC excitation signal provided by the second non-NFC IC 272.

It can be understood that each of the first matching circuit M1, the second matching circuit M2, and the third matching circuit M3 may include a circuit including capacitors and inductors that are in any series or parallel connection. Each of the first filter circuit LC1, the second filter circuit LC2, the third filter circuit LC3, and the fourth filter circuit LC4 may also include a circuit including capacitors and inductors that are in any series or parallel connection.

Figure 10:
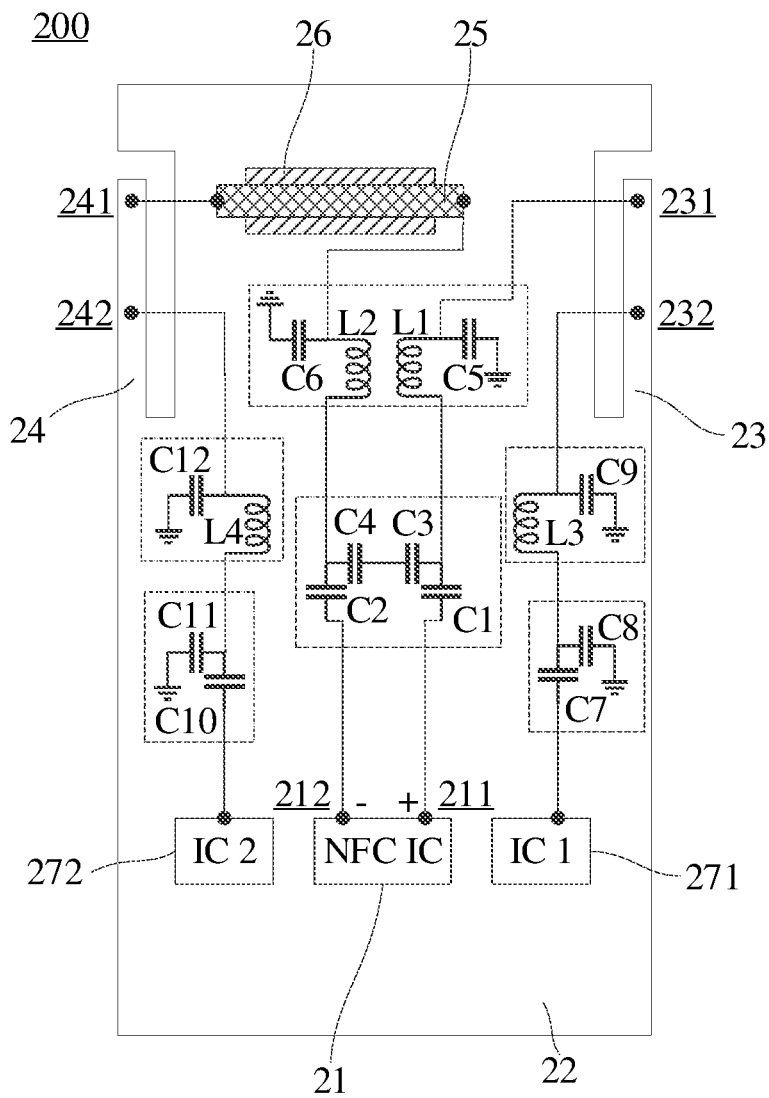
FIG. 10 is a sixth schematic diagram of an antenna assembly according to some embodiments of the present disclosure.

FIG. 10 is a sixth schematic diagram of an antenna assembly 200 according to some embodiments of the present disclosure.

For example, the first matching circuit M1 may include four capacitors C1, C2, C3, and C4. The capacitor C1 is connected in series with the first differential signal port 211 of the NFC IC 21, and the capacitor C2 is connected in series with the second differential signal port 212 of the NFC IC 21. The capacitor C3 is connected in series with the capacitor C4, and the connected C3 is connected in parallel with the NFC IC 21. It can be understood that capacitance values of the capacitors C1, C2, C3, and C4 can be set according to actual needs.

For example, the first filter circuit LC1 may include an inductor L1 and a capacitor C5. The inductor L1 is connected in series between the first matching circuit M1 and the first metal stub 23, and the capacitor C5 is connected in parallel with the NFC IC 21 and grounded. It can be understood that an inductance value of the inductor L1 and a capacitance value of the capacitor C5 can be set according to actual needs.

The second filter circuit LC2 may include, for example, an inductor L2 and a capacitor C6. The inductor L2 is connected in series between the first matching circuit M1 and the conductor 25, and the capacitor C6 is connected in parallel with the NFC IC 21 and grounded. It can be understood that an inductance value of the inductor L2 and a capacitance value of the capacitor C6 can be set according to actual needs.

The second matching circuit M2 may include, for example, capacitors C7 and C8. The capacitor C7 is connected in series between the first metal stub 23 and the first non-NFC IC 271, and the capacitor C8 is connected in parallel with the first non-NFC IC 271 and grounded. It can be understood that capacitance values of the capacitors C7 and C8 can be set according to actual needs.

The third filter circuit LC3 may include, for example, an inductor L3 and a capacitor C9. The inductor L3 is connected in series between the second matching circuit M2 and the first metal stub 23, and the capacitor C9 is connected in parallel with the first non-NFC IC 271 and grounded. It can be understood that an inductance value of the inductor L3 and a capacitance value of the capacitor C9 can be set according to actual needs.

For example, the third matching circuit M3 may include capacitors C10 and C11. The capacitor C10 is connected in series between the second metal stub 24 and the second non-NFC IC 272, and the capacitor C11 is connected in parallel with the second non-NFC IC 272 and grounded. It can be understood that capacitance values of the capacitors C10 and C11 can be set according to actual needs.

The fourth filter circuit LC4 may include, for example, an inductor L4 and a capacitor C12. The inductor L4 is connected in series between the third matching circuit M3 and the second metal stub 24, and the capacitor C12 is connected in parallel with the second non-NFC IC 272 and grounded. It can be understood that an inductance value of the inductor L4 and a capacitance value of the capacitor C12 can be set according to actual needs.

The antenna assembly and electronic device according to embodiments of the present disclosure are described in detail above. Specific examples are used in this document to describe the principle and implementation of the present disclosure, and the description of the above examples is only used to help understand the present disclosure. At the same time, for those skilled in the art, according to the idea of the present disclosure, there will be changes in specific implementations and an application range. In summary, the content of this specification should not be construed as a limitation of the present disclosure.

What is claimed is:

1. An antenna assembly, comprising:
 a near-field-communication (NFC) integrated-circuit (IC), comprising a first differential signal port and a second differential signal port, the first differential signal port and the second differential signal port being configured to provide a differential excitation current;
 a conductive loop, configured to transmit the differential excitation current and comprising:
  a ground plane, comprising:
   a first ground portion;
   a second ground portion spaced apart from the first ground portion; and
   a conductive path defined between the first ground portion and the second ground portion;
  a first metal stub, extending from the first ground portion and electrically connected to the first differential signal port; and
  a conductor, spaced apart from the ground plane, and electrically connected to the second differential signal port and the second ground portion, respectively; and
 a radiation-field enhancer, disposed between the conductor and the ground plane and configured to enhance a field strength of an NFC radiation-field generated by the conductor in response to the differential excitation current being transmitted.

2. The antenna assembly as claimed in claim 1, wherein the first metal stub generates a first NFC radiation field, the conductor generates a second NFC radiation field, and the conductive path generates a third NFC radiation field, in response to the differential excitation current being transmitted;
 wherein the second NFC radiation field is at least partially overlapped with the first NFC radiation field, and the third NFC radiation field is at least partially overlapped with the first NFC radiation field and the second NFC radiation field, respectively.

3. The antenna assembly as claimed in claim 1, wherein the conductor comprises a first conductor-segment, a second conductor-segment, and a third conductor-segment; and
the radiation-field enhancer is disposed between the ground plane and at least one of the first conductor-segment, the second conductor-segment, and the third conductor-segment.

4. The antenna assembly as claimed in claim 3, wherein the first conductor-segment extends in a first direction, the second conductor-segment extends in a second direction perpendicular to the first direction, and the third conductor-segment extends in the first direction, wherein both the first direction and the second direction are parallel to the ground plane.

5. The antenna assembly as claimed in claim 4, wherein the radiation-field enhancer comprises a ferrite layer.

6. The antenna assembly as claimed in claim 5, wherein the ferrite layer is symmetrical with respect to a direction in which the conductor extends, and an area of the ferrite layer is greater than an area of which the conductor is projected on the ferrite layer.

7. The antenna assembly as claimed in claim 2, wherein the conductive loop further comprises:
a second metal stub, extending from the second ground portion and electrically connected to the second differential signal port via the conductor.

8. The antenna assembly as claimed in claim 7, wherein the conductive path comprises a conductive sub-path parallel to a direction in which the conductor extends;
a first current-direction in which the differential excitation current is transmitted in the conductor is opposite to a second current-direction in which the differential excitation current is transmitted in the conductive sub-path; and
the radiation-field enhancer is configured to enhance the second NFC radiation field generated by the conductor in response to the differential excitation current being transmitted in the first current-direction and weaken another NFC radiation field generated by the conductive sub-path in response to differential excitation current being transmitted in the second current-direction.

9. The antenna assembly as claimed in claim 8, wherein the conductive path further comprises another conductive sub-path and a yet another conductive sub-path sequentially connected, wherein the another conductive sub-path extends along the first metal stub, and the yet another conductive sub-path extends along the second metal stub.

10. The antenna assembly as claimed in claim 7, wherein the second metal stub generates a fourth NFC radiation field, in response to the differential excitation current being transmitted;
wherein the second NFC radiation field is at least partially overlapped with the fourth NFC radiation field.

11. The antenna assembly as claimed in claim 1, further comprising:
a first matching circuit, configured to match an impedance of the conductive loop in response to the differential excitation current being transmitted and comprising:
a first port, electrically connected to the first differential signal port;
a second port, electrically connected to the second differential signal port;
a third port, electrically connected to the first metal stub; and
a fourth port, electrically connected to the conductor.

12. The antenna assembly as claimed in claim 1, further comprising:
a first non-NFC IC, configured to provide a first non-NFC excitation signal;
wherein the first metal stub is further electrically connected to the first non-NFC IC, and the first metal stub is further configured to transmit the first non-NFC excitation signal.

13. The antenna assembly as claimed in claim 12, wherein the first metal stub comprises:
a first feeding port, electrically connected to the first differential signal port; and
a third feeding port, spaced apart from the first feeding port and electrically connected to the first non-NFC IC;
wherein a distance between the first feeding port and the first ground portion is greater than a distance between the third feeding port and the first ground portion.

14. The antenna assembly as claimed in claim 13, further comprising:
a second matching circuit, electrically connected to the third feeding port and the first non-NFC IC, respectively, and configured to match an impedance of the first metal stub in response to the differential excitation current being transmitted.

15. The antenna assembly as claimed in claim 7, further comprising:
a second non-NFC IC, configured to provide a second non-NFC excitation signal;
wherein the second metal stub is further electrically connected to the second non-NFC IC, and the second metal stub is further configured to transmit the second non-NFC excitation signal.

16. The antenna assembly as claimed in claim 15, wherein the second metal stub comprises:
a second feeding port, electrically connected to the second differential signal port; and
a fourth feeding port, spaced apart from the second feeding port and electrically connected to the second non-NFC IC;
wherein a distance between the second feeding port and the second ground portion is greater than a distance between the fourth feeding port and the second ground portion.

17. The antenna assembly as claimed in claim 16, further comprising:
a third matching circuit, electrically connected to the fourth feeding port and the second non-NFC IC, respectively, and configured to match an impedance of the second metal stub in response to the differential excitation current being transmitted.

18. An electronic device, comprising an antenna assembly comprising:
a near-field-communication (NFC) integrated-circuit (IC), comprising a first differential signal port and a second differential signal port, the first differential signal port and the second differential signal port being configured to provide a differential excitation current;
a conductive loop, configured to transmit the differential excitation current and comprising:
a ground plane, comprising:
a first ground portion;
a second ground portion spaced apart from the first ground portion; and
a conductive path defined between the first ground portion and the second ground portion;

a first metal stub, extending from the first ground portion and electrically connected to the first differential signal port; and a conductor, spaced apart from the ground plane, and electrically connected to the second differential signal port and the second ground portion, respectively; and a radiation-field enhancer, disposed between the conductor and the ground plane and configured to enhance a field strength of an NFC radiation-field, the NFC radiation-field being generated by the conductor in response to the differential excitation current being transmitted.

19. An electronic device, comprising:

a housing, comprising a metal cover, the metal cover comprising a ground plane defining a first gap such that a first stub is formed;

a near-field-communication (NFC) integrated-circuit (IC), comprising a first differential signal port electrically connected to the first stub and a second differential signal port for providing a differential excitation current;

a conductor, spaced apart from the ground plane, and electrically connected to the second differential signal port and the second ground portion, respectively; and a radiation-field enhancer, disposed between the conductor and the ground plane and configured to enhance a field strength of an NFC radiation-field, the NFC radiation-field being generated by the conductor in response to the differential excitation current being transmitted.

20. The electronic device of claim 19, wherein the ground plane further defines a second gap such that a second stub is formed, and the second stub is electrically connected to the second differential signal port via the conductor; and the first stub is spaced apart from the second stub, and a first direction in which the first stub extends is parallel to a second direction in which the second stub extends.

* * * * *